(12) United States Patent
Chen et al.

(10) Patent No.: US 9,531,370 B1
(45) Date of Patent: Dec. 27, 2016

(54) TRANSMITTER, COMMON MODE TRANSCEIVER USING THE SAME, AND OPERATING METHOD THEREOF

(71) Applicant: UBIQ Semiconductor Corp., Hsinchu County (TW)

(72) Inventors: Chih-Hao Chen, Hsinchu County (TW); Kei-Kang Hung, Hsinchu County (TW)

(73) Assignee: UBIQ Semiconductor Corp., Hsinchu County (TW)

( * ) Notice: Subject to any disclaimer, the term of this patent is extended or adjusted under 35 U.S.C. 154(b) by 0 days.

(21) Appl. No.: 15/003,800

(22) Filed: Jan. 22, 2016

(30) Foreign Application Priority Data

Jun. 18, 2015 (TW) ................................ 104119758

(51) Int. Cl.
| | |
|---|---|
| *H03K 17/081* | (2006.01) |
| *H03K 17/10* | (2006.01) |
| *H04B 3/00* | (2006.01) |
| *H03K 17/16* | (2006.01) |
| *H04B 1/40* | (2015.01) |
| *H04B 15/00* | (2006.01) |

(52) U.S. Cl.
CPC ............. *H03K 17/161* (2013.01); *H04B 1/40* (2013.01); *H04B 15/005* (2013.01)

(58) Field of Classification Search
CPC  H03K 17/081; H03K 17/08104; H03K 17/10; H03K 17/17102; H03K 19/0175; H04B 1/04; H04B 3/00; H03F 3/04
USPC ..... 327/109, 112, 309, 321, 339; 455/114.2, 455/127.1
See application file for complete search history.

(56) References Cited

U.S. PATENT DOCUMENTS

| | | | |
|---|---|---|---|
| 7,227,400 B1 | 6/2007 | Gillespie et al. | |
| 7,242,227 B2 | 7/2007 | Pauletti et al. | |
| 8,547,140 B1* | 10/2013 | Faucher | H03K 19/00361 326/33 |
| 9,013,212 B2* | 4/2015 | Kumar | G11C 7/1057 327/108 |
| 2010/0315168 A1* | 12/2010 | Li | H03F 1/0244 330/310 |
| 2012/0200338 A1* | 8/2012 | Olson | H03K 17/145 327/534 |
| 2014/0002146 A1* | 1/2014 | Kim | H03K 17/08104 327/109 |
| 2015/0280701 A1* | 10/2015 | Park | H03K 17/08 327/379 |

FOREIGN PATENT DOCUMENTS

GB          2469634 A   * 10/2010    ....... H03K 19/00315

* cited by examiner

*Primary Examiner* — Blane Jackson
(74) *Attorney, Agent, or Firm* — Jianq Chyun IP Office (57) ABSTRACT

A transmitter, a common mode transceiver using the same, and an operating method thereof are provided. The transmitter includes a first transistor group and a second transistor group. The first transistor group includes a first transistor connected in series with a second transistor, wherein the second transistor is applied a first well-tracking control. The second transistor group includes a third transistor connected in series with a fourth transistor, wherein the third transistor is applied a second well-tracking control. There is an output node between the first transistor group and the second transistor group, and the second transistor and the third transistor are coupled to the output node. The present invention can effectively block leakage paths in common mode operation, and can enhance ESD protection capability.

14 Claims, 9 Drawing Sheets

TRANSMITTER, COMMON MODE TRANSCEIVER USING THE SAME, AND OPERATING METHOD THEREOF

CROSS-REFERENCE TO RELATED APPLICATION

This application claims the priority benefit of Taiwan application serial no. 104119758, filed on Jun. 18, 2015. The entirety of the above-mentioned patent application is hereby incorporated by reference herein and made a part of this specification.

BACKGROUND OF THE INVENTION

Field of the Invention

The invention relates to a radio frequency technique, and particularly relates to a transmitter, a common mode transceiver using the transmitter and an operating method thereof.

Description of Related Art

Figure 1:
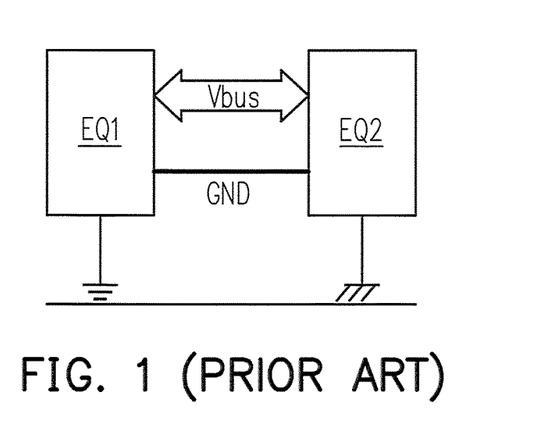
FIG. 1 is a structural diagram of ground potential connection between two communication equipment in a communication system.

In a communication system, if a distance between two communication equipment is very far away, a problem that the two equipment have different ground potentials is encountered. According to a commonly used conventional technique, there are two solutions for resolving the above problem. Referring to FIG. 1 for the first conventional solution, FIG. 1 is a structural diagram of ground potential connection between the two communication equipment in the communication system. Besides that a transmission interface between the two communication equipment EQ1, EQ2 is used for transmitting signals (for example, the transmitted signals include an interface voltage Vbus), ground potential signal pins of the two communication equipment are connected to achieve a same ground potential GND. However, such solution has two disadvantages, and the first disadvantage is that a connection port of the communication equipment is required to use the ground potential signal pin, and the second disadvantage is that when the ground potential between the two communication equipment EQ1 and EQ2 is excessively large, when the different ground potentials are forced to be connected, since a resistance of a connection line is in a micro-ohm level, a large current (I=V/R) is probably generated, and the large current is bound to produce a magnetic field to influence a normal signal communication, which may cause communication failure.

Figure 2:
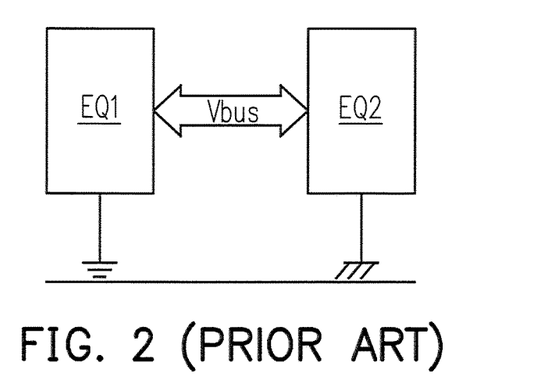
FIG. 2 is a structural diagram of two communication equipment in a communication system having a common mode range interface.

Referring to FIG. 2 for the second conventional solution, FIG. 2 is a structural diagram of the two communication equipment in the communication system having a common mode range interface. The communication equipment EQ1 and EQ2 are implemented by common mode transceivers, and in a common mode voltage range, the communication equipment EQ1 and EQ2 are allowed to have different ground potentials.

Figure 3:
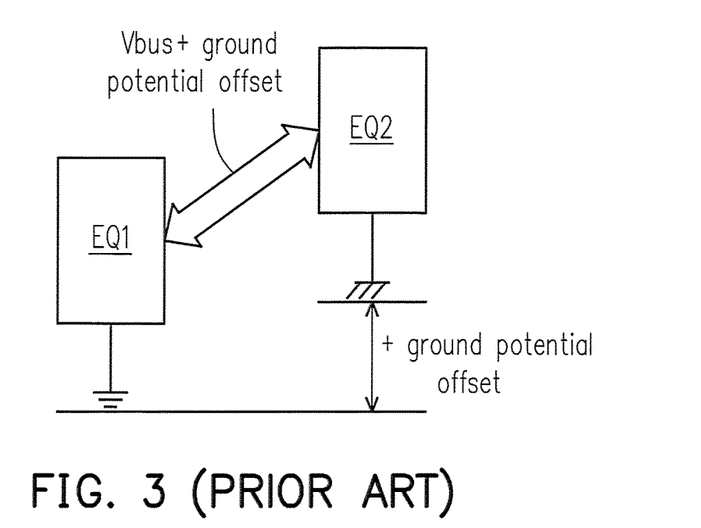
FIG. 3 is a schematic diagram illustrating a positive ground potential offset between two communication equipment.

Referring to FIG. 3, FIG. 3 is a structural diagram based on FIG. 2, which illustrates a positive ground potential offset between the communication equipment EQ1 and EQ2. For example, when the common mode voltage range of the communication equipment EQ1 is 0V to 5V, and the positive ground potential offset is 7V, a demand of the common mode voltage range of the communication equipment EQ2 is 7V to 12V.

Figure 4:
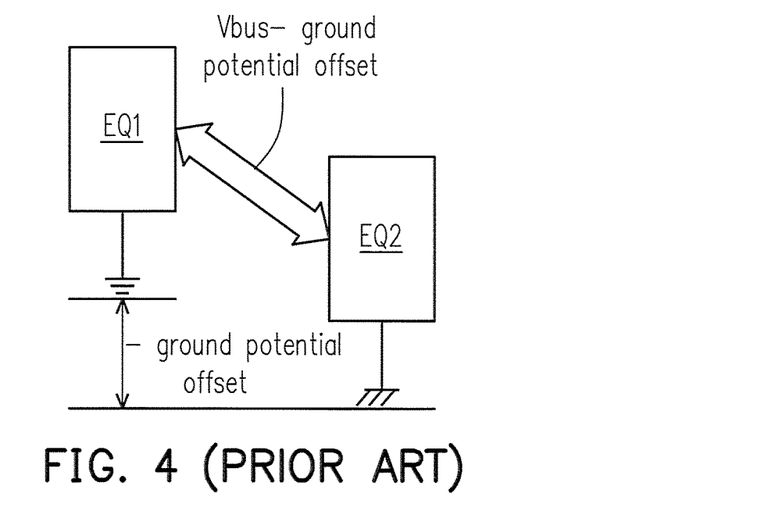
FIG. 4 is a schematic diagram illustrating a negative ground potential offset between two communication equipment.

Moreover, referring to FIG. 4, FIG. 4 is a structural diagram based on FIG. 2, which illustrates a negative ground potential offset between the communication equipment EQ1 and EQ2. For example, when the common mode voltage range of the communication equipment EQ1 is 0V to 5V, and the negative ground potential offset is −7V, a demand of the common mode voltage range of the communication equipment EQ2 is −7V to −2V. On the other hand, if the communication equipment EQ2 is required to simultaneously deal with the positive ground potential offset and the negative ground potential offset, a demand of the common mode voltage range thereof is −7V to +12V.

Figure 5:
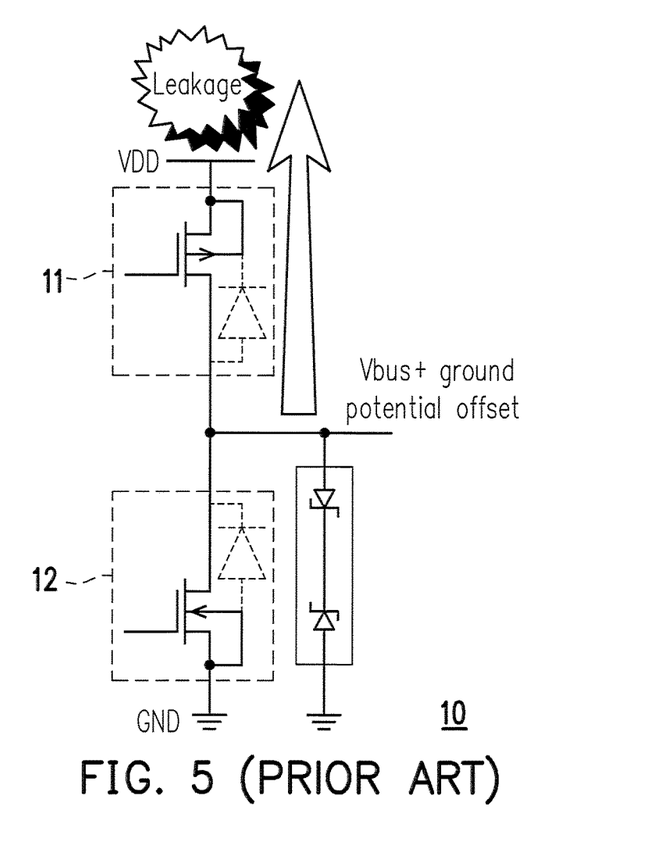
FIG. 5 is a schematic diagram of a leakage path when a transmitter of a common mode transceiver has the positive ground potential offset.
Figure 6:
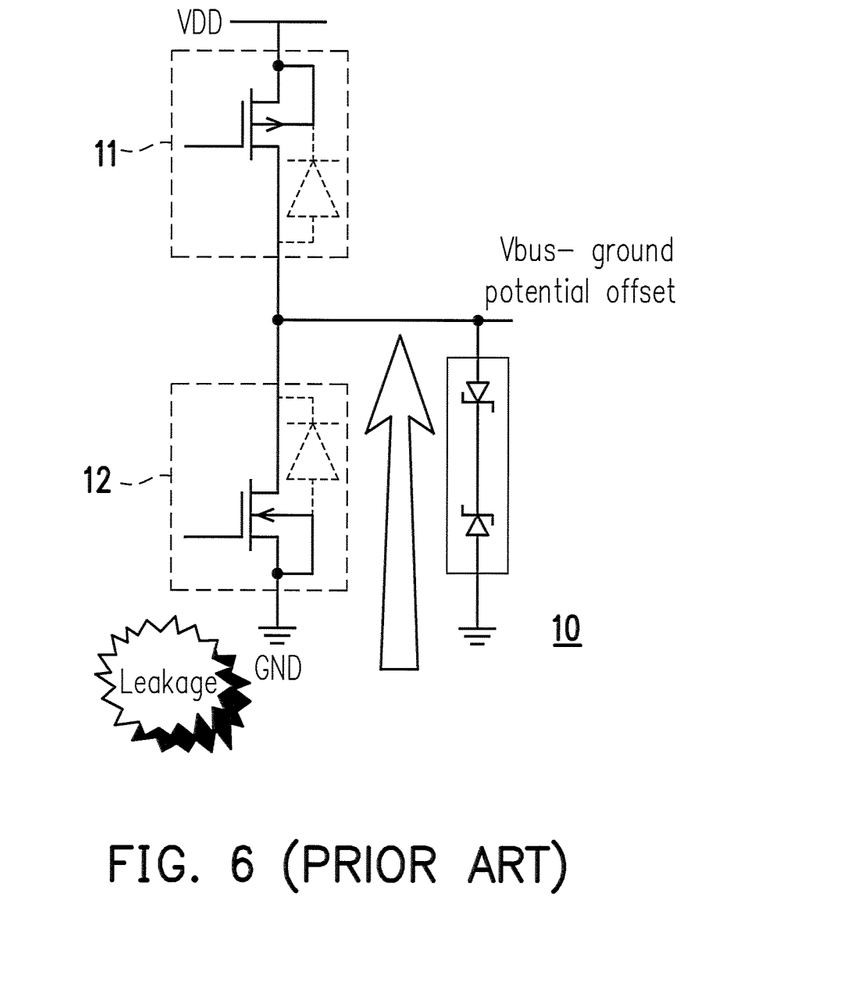
FIG. 6 is a schematic diagram of a leakage path when a transmitter of the common mode transceiver has the negative ground potential offset.

When the communication equipment EQ1 and EQ2 are all common mode transceivers, and the positive ground potential offset or the negative ground potential offset exists between the two communication equipment EQ1 and EQ2, according to related regulation, signals are required to be normally transceived within the ground potential offset range and additional leakage is not allowed. Referring to FIG. 5 or FIG. 6. FIG. 5 is a schematic diagram of a leakage path when a transmitter of the common mode transceiver has the positive ground potential offset. FIG. 6 is a schematic diagram of a leakage path when the transmitter of the common mode transceiver has the negative ground potential offset. Generally, a pull-up circuit 11 or a pull-down circuit 12 of the transmitter 10 of the transceiver all have a parasitic diode.

In FIG. 5, when the interface voltage Vbus is greater than a power voltage VDD, a leakage path where current flows from the interface voltage Vbus to the power voltage VDD through the parasitic diode is formed. Similarly, in FIG. 6, when the interface voltage Vbus is smaller than the ground potential GND, a leakage path where current flows from the ground potential GND to the interface voltage Vbus through the parasitic diode is formed.

Figure 7:
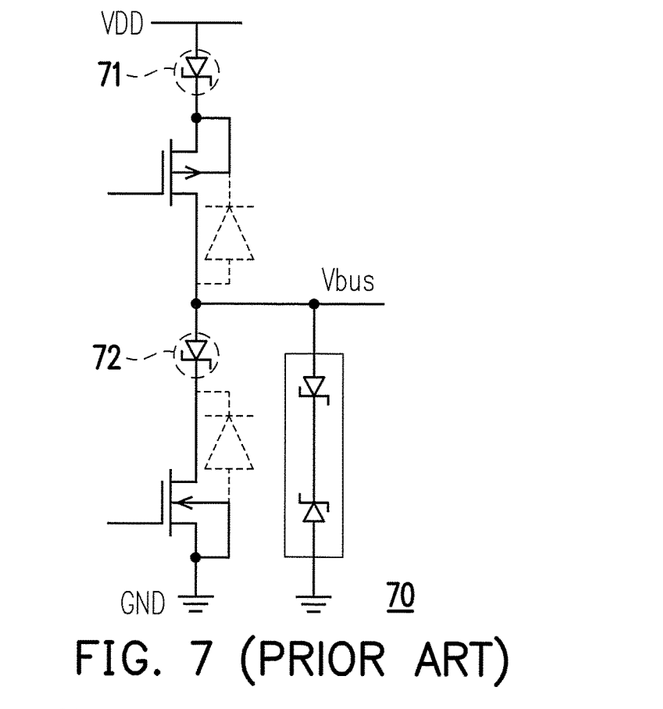
FIG. 7 is a circuit diagram illustrating a transmitter of a conventional common mode transceiver.

In order to resolve the problem of the leakage path, referring to FIG. 7, FIG. 7 is a circuit diagram illustrating a transmitter of a conventional common mode transceiver. A reverse diode 71 is disposed on a path where current flows from the interface voltage Vbus to the power voltage VDD for connecting the pull-up circuit in series, so as to block the leakage path of the positive ground potential offset; and another reverse diode 72 is disposed on a path where current flows from the ground potential GND to the interface voltage Vbus for connecting the pull-down circuit in series, so as to block the leakage path of the negative ground potential offset. However, the above solution has a disadvantage that an upper limit and a lower limit of the common mode voltage range are respectively decreased by a cut in voltage of one diode, so that output capability of the transmitter 70 is deteriorated. For example, before the two reverse diodes are configured, the common mode voltage range is 0 to VDD, and after the two reverse diodes are configured, the common mode voltage range is decreased to 0.7 to VDD−0.7.

SUMMARY OF THE INVENTION

The invention is directed to a transmitter, a common mode transceiver using the transmitter and an operating method thereof, by which the problem mentioned in the related art is resolved.

The invention provides a transmitter of a common mode transceiver, and the transmitter includes a first transistor group and a second transistor group. The first transistor group includes a first transistor and a second transistor connected in series with each other, wherein the second transistors is applied a first well-tracking control. The second transistor group includes a third transistor and a fourth transistor connected in series with each other, wherein the third transistor is applied a second well-tracking control.

There is an output node between the first transistor group and the second transistor group, and the second transistor and the third transistor are coupled to the output node.

In an embodiment of the invention, the transmitter further includes a first circuit coupled to the output node and a ground potential, and is configured to perform transient voltage suppression.

In an embodiment of the invention, the second transistor has a second circuit, the second circuit performs the first well-tracking control, and controls a first well-voltage of the second transistor according to a first highest voltage exerted to a source or a drain of the second transistor. The third transistor has a third circuit, the third circuit performs the second well-tracking control, and controls a second well-voltage of the third transistor according to a second highest voltage exerted to a source or a drain of the third transistor.

In an embodiment of the invention, the first transistor and the second transistor are respectively a low-voltage P-type metal oxide semiconductor transistor and a high-voltage P-type metal oxide semiconductor transistor, and a circuit area of the first transistor is configured between ½ and ¼ of a circuit area of the second transistor.

In an embodiment of the invention, the third transistor and the fourth transistor are respectively a high-voltage N-type metal oxide semiconductor transistor and a low-voltage N-type metal oxide semiconductor transistor, and a circuit area of the fourth transistor is configured between ½ and ¼ of a circuit area of the third transistor.

The invention provides a common mode transceiver including a transmitter, a first circuit and a receiver. The transmitter includes an output stage. The first circuit is coupled to an output node and a ground potential to perform transient voltage suppression. The receiver is coupled to the output node. The output stage includes a first transistor group and a second transistor group. The first transistor group includes a first transistor and a second transistor connected in series with each other, wherein the second transistor is applied a first well-tracking control. The second transistor group includes a third transistor and a fourth transistor connected in series with each other, wherein the third transistor is applied a second well-tracking control. There is an output node between the first transistor group and the second transistor group, and the second transistor and the third transistor are coupled to the output node.

The invention provides an operating method of a common mode transceiver. The operating method includes following steps. A first transistor group is provided, wherein the first transistor group includes a first transistor and a second transistor connected in series with each other. A second transistor group is provided, wherein the second transistor group includes a third transistor and a fourth transistor connected in series with each other. The second transistor and the third transistor respectively operate by performing a first well-tracking control and a second well-tracking control.

In an embodiment of the invention, the operating method further includes providing a first circuit coupled to an output node and a ground potential to implement transient voltage suppression.

In an embodiment of the invention, the step of respectively operating the second transistor and the third transistor by performing the first well-tracking control and the second well-tracking control includes following steps. A second circuit is configured to the second transistor, wherein the second circuit performs the first well-tracking control, and controls a first well-voltage of the second transistor according to a first highest voltage exerted to a source or a drain of the second transistor. A third circuit is configured to the third transistor, wherein the third circuit performs the second well-tracking control, and controls a second well-voltage of the third transistor according to a second highest voltage exerted to a source or a drain of the third transistor.

According to the above description, in the transmitter, the common mode transceiver using the transmitter and the operating method thereof, a plurality of transistors connected in series is used in the output stage. The transistors connected in series include a low-voltage element and a high-voltage element. The high-voltage element performs a well-tracking control to block the leakage path of the positive ground potential offset or the negative ground potential offset, and mitigate the problem of inadequate driving capability of the output stage. The low-voltage element is used for increasing a maximum voltage of the circuit to be protected, so as to improve an electrostatic discharge (ESD) protection capability in transient voltage suppression. On the other hand, the circuit area of the low-voltage element is configured between ½ and ¼ of the circuit area of the high-voltage element, such that a problem of excessively large circuit area encountered when all of the transistors adopt the high-voltage elements is avoided, and an overall chip area is saved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In the following embodiments, when "A" device is referred to be "electrically connected" to "B" device, the "A" device can be directly connected or coupled to the "B" device, or other devices probably exist there between, or the two devices can communicated with each other through an electric signal. A term "circuit" can represent at least one device or a plurality of devices or devices actively and/or passively coupled to each other to provide a suitable function. A term "signal" can represent at least one current, voltage, load, temperature, data or other signal. It should be understood that a physical property of the signals referred throughout the descriptions and figures can be voltage or current.

It should be understood that in the following descriptions, although terms such as "first", "second", etc. are used to describe various components, these components are not limited by the aforementioned terms, and these terms are only used for distinguishing one component from another. For example, the first signal can also be referred to as the second signal, and the second signal can also be referred to as the first signal without departing from the spirit and scope of the present invention.

Figure 8:
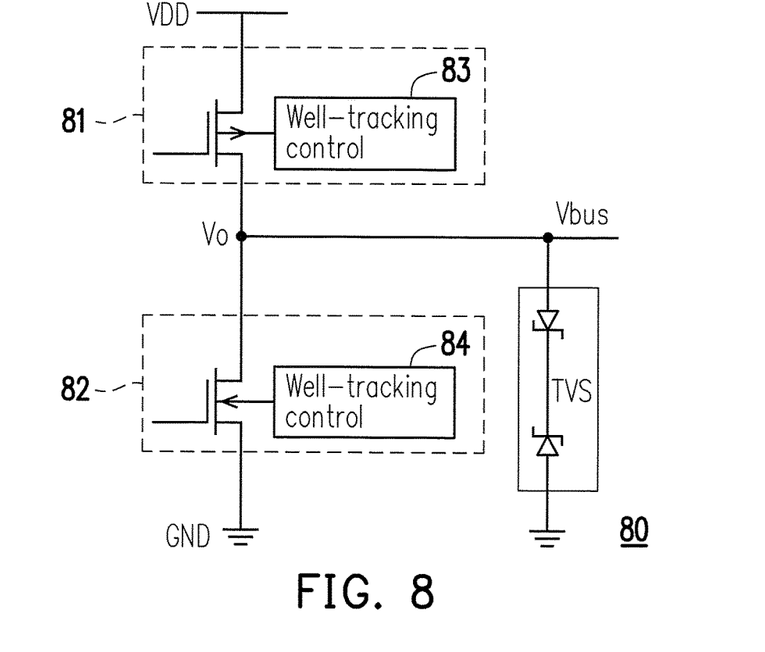
FIG. 8 is a circuit diagram of a transmitter of a common mode transceiver according to an embodiment of the invention.

Referring to FIG. 8, FIG. 8 is a circuit diagram of a transmitter of a common mode transceiver according to an embodiment of the invention. The transmitter 80 includes a transistor 81 and a transistor 82 connected in series with each other. There is an output node Vo between the transistor 81 and the transistor 82. The transistor 81 has a second circuit 83. During a normal operation, a well-voltage exerted to the transistor 81 can be 5V of a power voltage VDD, though the invention is not limited thereto. The second circuit 83 performs a first well-tracking control, and controls the well-voltage of the transistor 81 to be equal to a highest voltage exerted to a source or a drain of the transistor 81 according to the highest voltage exerted to the source or the drain of the transistor 81. Similarly, the transistor 82 has a third circuit 84. The third circuit 84 performs a second well-tracking control, and controls the well-voltage of the transistor 82 to be equal to a highest voltage exerted to a source or a drain of the transistor 82 according to the highest voltage exerted to the source or the drain of the transistor 82.

Figure 9:
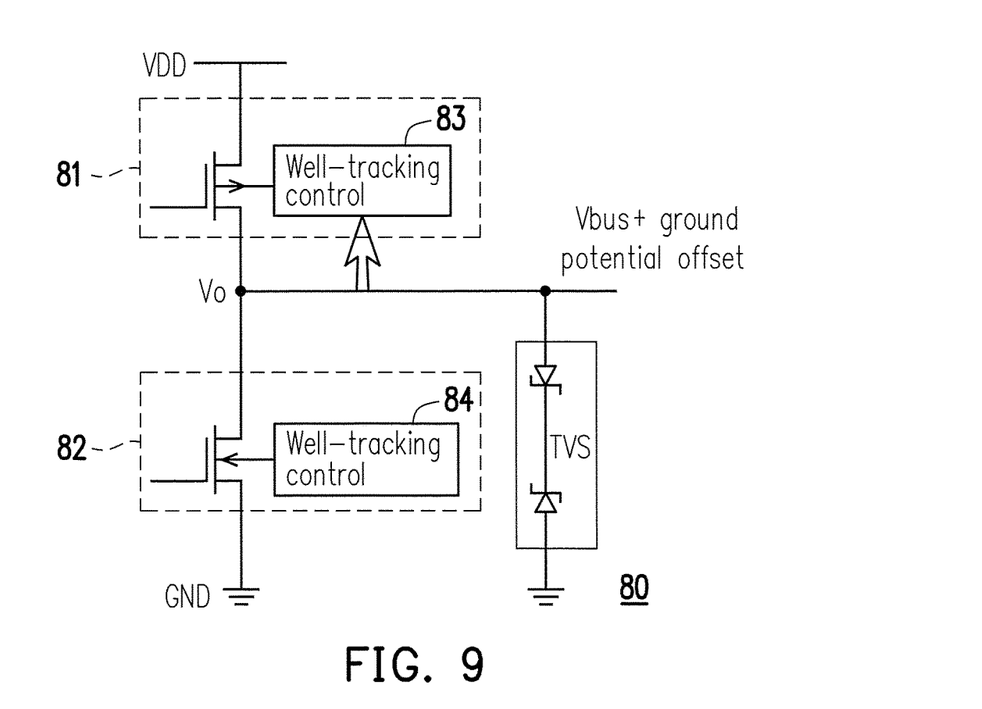
FIG. 9 is a schematic diagram illustrating a situation that a transmitter performs a well-tracking control to block a leakage path of a positive ground potential offset according to an embodiment of the invention.

Referring to FIG. 9, FIG. 9 is a schematic diagram illustrating a situation that the transmitter performs a well-tracking control to block a leakage path of a positive ground potential offset according to an embodiment of the invention. The second circuit 83 has a first well-tracking control and can control the well-voltage of the transistor 81 to block a leakage path of a positive ground potential offset. In other words, the well-voltage of the transistor 81 follows the highest voltage on the source or the drain of the transistor 81, and when an interface voltage Vbus plus the positive ground potential offset is greater than the power voltage VDD, the well-voltage of the transistor 81 is equal to the interface voltage Vbus plus the positive ground potential offset, so that the well-voltage of the transistor 81 is floating, and can block the leakage path of current flowing from the interface voltage Vbus to the power voltage VDD.

Figure 10:
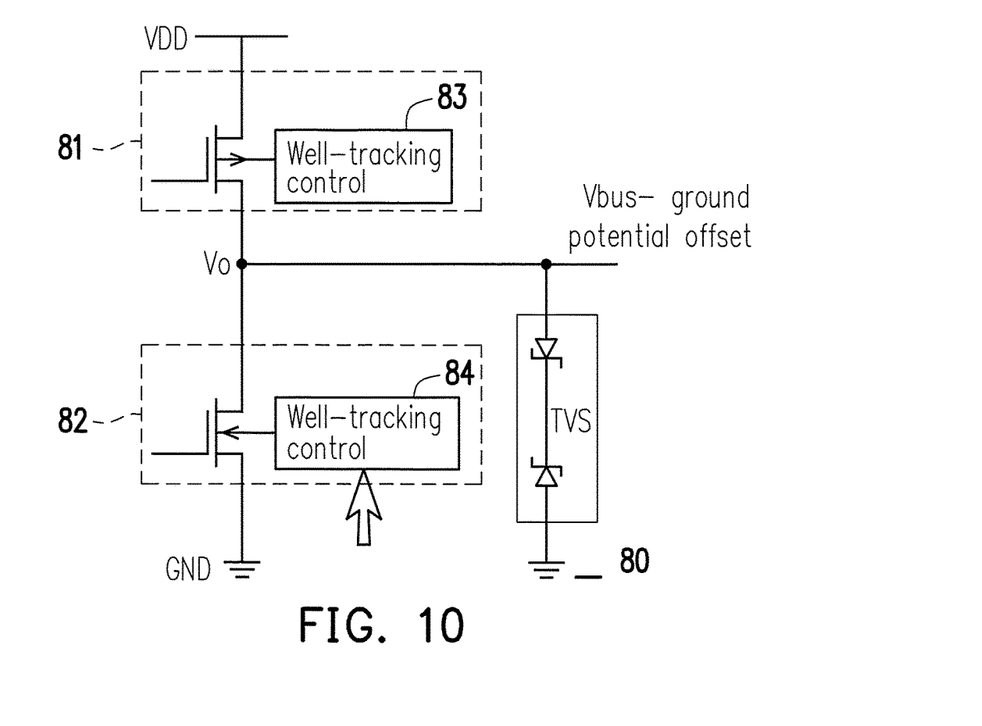
FIG. 10 is a schematic diagram illustrating a situation that a transmitter performs a well-tracking control to block a leakage path of a negative ground potential offset according to an embodiment of the invention.

Referring to FIG. 10, FIG. 10 is a schematic diagram illustrating a situation that the transmitter performs a well-tracking control to block a leakage path of a negative ground potential offset according to an embodiment of the invention. The third circuit 84 has a second well-tracking control and can control the well-voltage of the transistor 82 to block a leakage path of a negative ground potential offset. In other words, the well-voltage of the transistor 82 follows the highest voltage on the source or the drain of the transistor 82, and when the interface voltage Vbus plus the negative ground potential offset is smaller than the ground potential GND, the well-voltage of the transistor 82 is equal to the ground potential GND, so that the well-voltage of the transistor 82 is floating, and can block the leakage path of current flowing from the ground potential GND to the interface voltage Vbus.

It should be noted that in the present embodiment, the second circuit 83 and the third circuit 84 respectively having the first well-tracking control and the second well-tracking control are used to effectively block the two leakage paths in common mode operation, and a problem of the conventional technique that the output capability is deteriorated due to configuration of a reverse diode is avoided.

Moreover, the transmitter 80 may further include a first circuit TVS. The first circuit TVS is coupled to the output node Vo and the ground potential GND, and serves as an electrostatic discharge (ESD) protector, so as to implement transient voltage suppression. For example, an ESD, a high speed transient surge, a lightning, a cable discharging event, or other interference event is suppressed.

Figure 11:
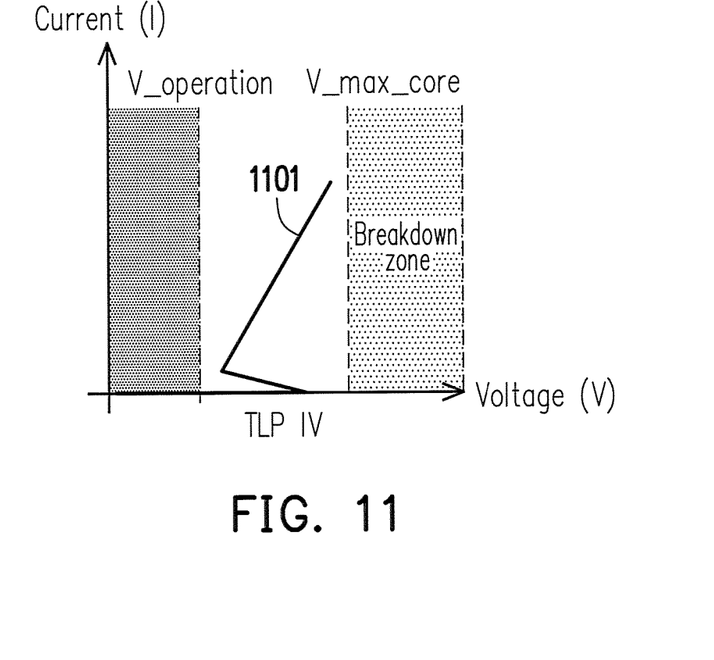
FIG. 11 and FIG. 12 are transmission line pulse (TLP) IV curve diagrams.
Figure 12:
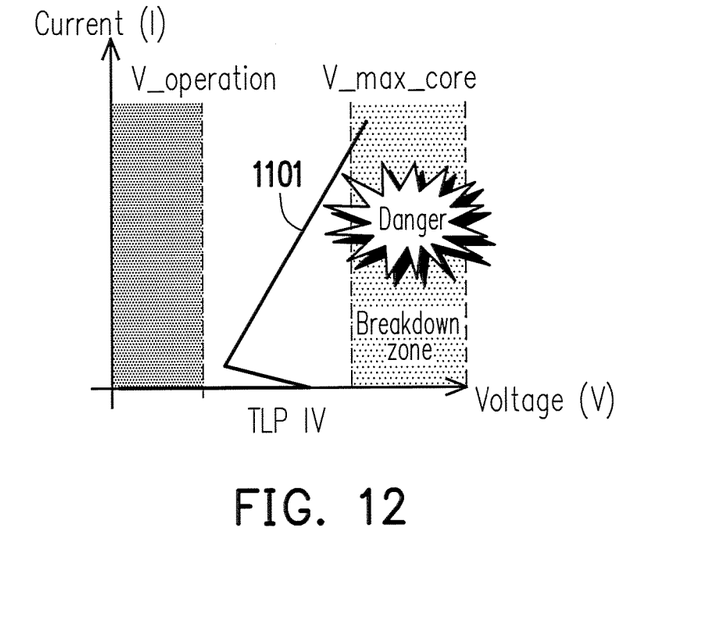

Moreover, when the first circuit TVS is built in a chip of the transmitter 80, a whole ESD protection capability is limited. Referring to FIG. 11, FIG. 11 is a transmission line pulse (TLP) IV curve diagram. A curve 1101 represents a characteristic of the first circuit TVS, and the greater the value of the curve 1101 is, the higher the ESD energy is, though a voltage of the TLP IV curve is required to be greater than a voltage V_operation and smaller than a maximum voltage V_max_core. For example, the maximum voltage V_max_core is 8 KV, though the invention is not limited thereto. When the TLP IV curve exceeds the maximum voltage V_max_core, it means that the circuit to be protected by the first circuit TVS (the circuit to be protected refers to the transmitter of the transceiver) enters a breakdown zone and is in danger, as shown in FIG. 12, so that the whole protection capability is limited by the output stage of the transmitter.

Figure 13:
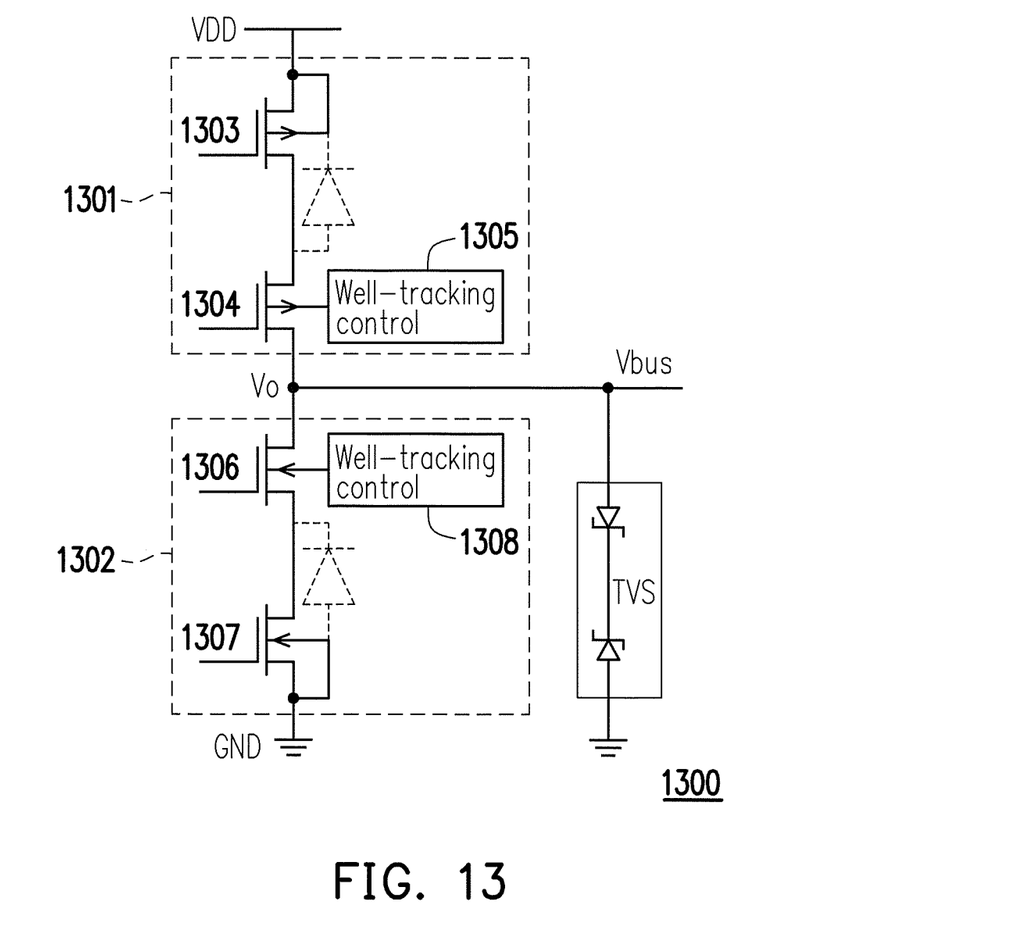
FIG. 13 is a circuit diagram of a transmitter of a common mode transceiver according to an embodiment of the invention.

Referring to FIG. 13, FIG. 13 is a circuit diagram of a transmitter of a common mode transceiver according to an embodiment of the invention. The transmitter 1300 of the common mode transceiver may include a first transistor group 1301 and a second transistor group 1302. The first transistor group 1301 includes a first transistor 1303 and a second transistor 1304 connected in series with each other, and the second transistor group 1302 includes a third transistor 1306 and a fourth transistor 1307 connected in series with each other. A source of the first transistor 1303 is coupled to the power voltage VDD. A drain of the first transistor 1303 is coupled to a source of the second transistor 1304. A drain of the second transistor 1304 is coupled to a drain of the third transistor 1306. A source of the third transistor 1306 is coupled to a drain of the fourth transistor 1307, and a source of the fourth transistor 1307 is coupled to the ground potential GND. There is an output node Vo between the first transistor group 1301 and the second transistor group 1302, and the second transistor 1304 and the third transistor 1306 are coupled to the output node Vo.

The second transistor 1304 is applied a first well-tracking control, so that a second circuit 1305 is configured. The second circuit 1305 performs the first well-tracking control, and controls a first well-voltage of the second transistor 1304 to be equal to a first highest voltage exerted to the source or the drain of the second transistor 1304 according to the first highest voltage exerted to the source or the drain of the second transistor 1304. Similarly, the third transistor 1306 is applied a second well-tracking control, so that a third circuit 1308 is configured. The third circuit 1308 performs the second well-tracking control, and controls a second well-voltage of the third transistor 1306 to be equal to a second highest voltage exerted to the source or the drain of the third transistor 1306 according to the second highest voltage exerted to the source or the drain of the third transistor 1306. The second circuit 1305 has the first well-tracking control and can control the first well-voltage of the second transistor 1304. The first well-voltage is floating and can block a leakage path of the positive ground potential offset. Similarly, the third circuit 1308 has the second well-tracking control and can control the second well-voltage of the third transistor 1306. The second well-voltage is floating and can block a leakage path of the negative ground potential offset.

Moreover, any one of the first transistor group 1301 and the second transistor group 1302 can be composed of two transistors or more than two transistors. The aforementioned embodiment is only an example, and is not used for limiting the invention.

Figure 14:
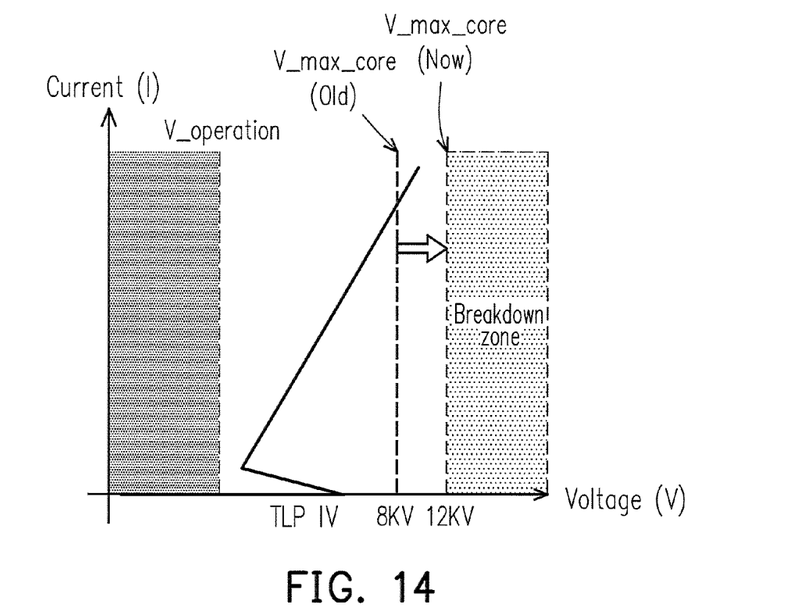
FIG. 14 is a TLP IV curve diagram according to an embodiment of the invention.

In the circuit structure of FIG. 13, the output stage of the transmitter 1300 performs the first well-tracking control and the second well-tracking control to effectively block the leakage path in the common mode operation. On the other hand, in collaboration with the serially connected circuits (the first transistor 1303 and the fourth transistor 1307), the maximum voltage V_max_core of the first circuit TVS (the first circuit TVS serves as the ESD protector) is increased. As shown in FIG. 14, the maximum voltage V_max_core is increased from 8 KV to 12 KV, though the invention is not limited thereto. In this way, the ESD protection capability is improved.

Referring to FIG. 13 again, in an embodiment, the first transistor 1303 and the second transistor 1304 can be respectively a low-voltage P-type metal oxide semiconductor (PMOS) transistor and a high-voltage PMOS transistor, and a circuit area of the first transistor 1303 is configured between ½ and ¼ of a circuit area of the second transistor 1304. The third transistor 1306 and the fourth transistor 1307 are respectively a high-voltage N-type metal oxide semiconductor (NMOS) transistor and a low-voltage NMOS transistor, and a circuit area of the fourth transistor 1307 is configured between ½ and ¼ of a circuit area of the third transistor 1306. As a part of the transistors of the transmitter 1300 adopts the low-voltage element, a situation that all of the transistors adopt the high-voltage element is avoided, so as to avoid a problem that the overall circuit area is excessively large. In this way, an overall chip area is saved.

In another embodiment, if the overall chip area is not considered, the first transistor 1303, the second transistor 1304, the third transistor 1306 and the fourth transistor 1307 may all adopt the high-voltage elements for implementation.

Figure 15:
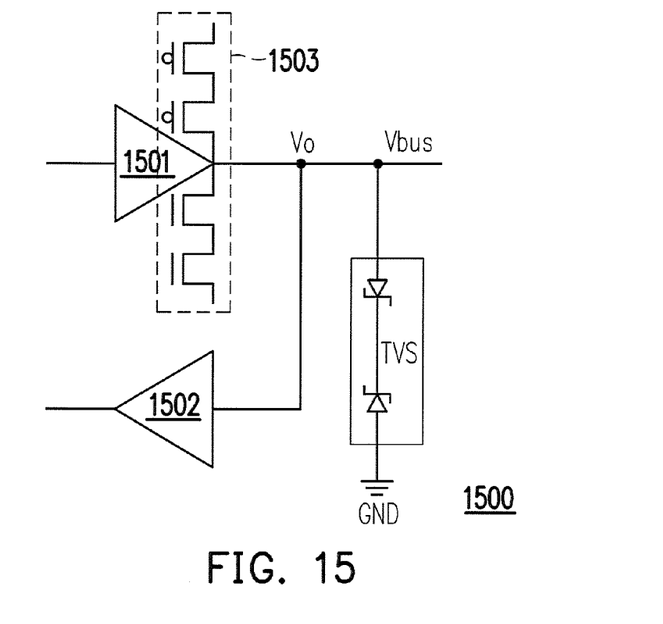
FIG. 15 is a structural diagram of a common mode transceiver according to an embodiment of the invention.

Referring to FIG. 15, FIG. 15 is a structural diagram of a common mode transceiver according to an embodiment of the invention. The common mode transceiver 1500 includes a transmitter 1501, a first circuit TVS and a receiver 1502. The transmitter 1501 includes an output stage 1503. The first circuit TVS is coupled to an output node Vo and a ground potential GND to implement transient voltage suppression. The receiver 1502 is coupled to the output node Vo. The output stage 1503 may include the first transistor group 1301 and the second transistor group 1302 shown in FIG. 13. The construction and principle of the first transistor group 1301 and the second transistor group 1302 may refer to the aforementioned description, which are not repeated.

Figure 16:
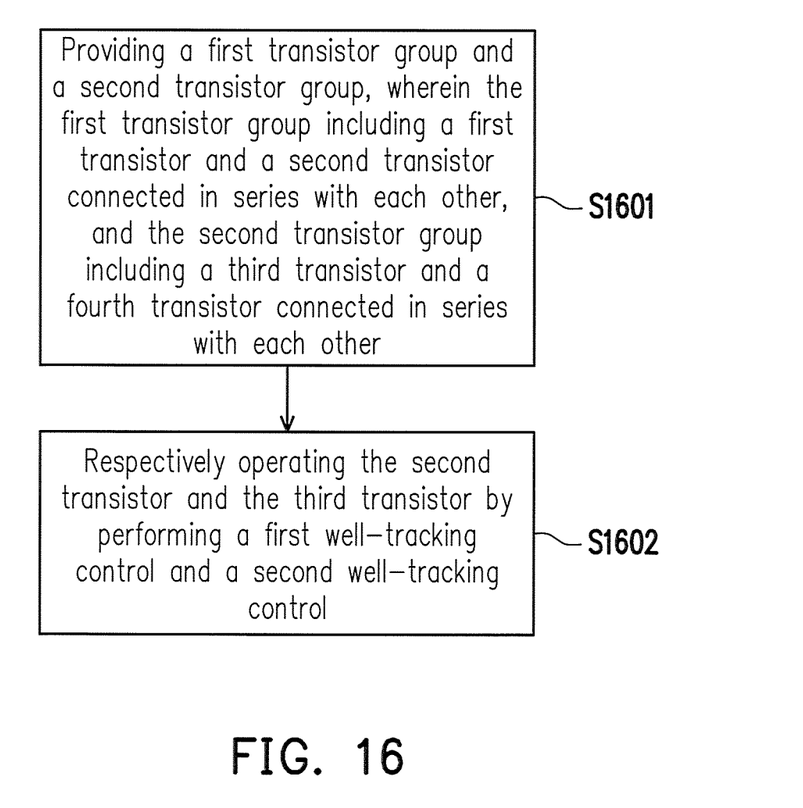
FIG. 16 is a flowchart illustrating an operating method of a common mode transceiver according to an embodiment of the invention.

According to the above disclosure, a universal operating method of a common mode transceiver is deduced. To be specific, FIG. 16 is a flowchart illustrating an operating method of a common mode transceiver according to an embodiment of the invention. Referring to FIG. 13 and FIG. 16, the operating method of the common mode transceiver of the present embodiment may include following steps.

In step S1601, the first transistor group 1301 and the second transistor group 1302 are provided, wherein the first transistor group 1301 includes the first transistor 1303 and the second transistor 1304 connected in series with each other, and the second transistor group 1302 includes the third transistor 1306 and the fourth transistor 1307 connected in series with each other.

Then, in step S1602, the second transistor 1304 and the third transistor 1306 respectively operate by performing a first well-tracking control and a second well-tracking control.

Moreover, the operating method may further includes providing the first circuit TVS coupled to the output node Vo and the ground potential GND to implement transient voltage suppression.

In another embodiment, the step of respectively operating the second transistor and the third transistor by performing the first well-tracking control and the second well-tracking control (the step S1602) includes following steps. The second circuit 1305 is configured to the second transistor 1304, and the second circuit 1305 performs the first well-tracking control, and controls a first well-voltage of the second transistor 1304 according to a first highest voltage exerted to the source or the drain of the second transistor 1304. The third circuit 1308 is configured to the third transistor 1306, and the third circuit 1308 performs the second well-tracking control, and controls a second well-voltage of the third transistor 1306 according to a second highest voltage exerted to the source or the drain of the third transistor 1306.

In summary, in the transmitter, the common mode transceiver using the transmitter and the operating method thereof, a plurality of transistors connected in series is used in the output stage. The transistors connected in series include a low-voltage element and a high-voltage element. The high-voltage element performs a well-tracking control to block the leakage path of the positive ground potential offset or the negative ground potential offset, and mitigate the problem of inadequate driving capability of the output stage. The low-voltage element is used for increasing a maximum voltage of the circuit to be protected, so as to improve the ESD protection capability in transient voltage suppression. On the other hand, the circuit area of the low-voltage element is configured between ½ and ¼ of the circuit area of the high-voltage element, such that a problem of excessively large circuit area encountered when all of the transistors adopt the high-voltage elements is avoided, and an overall chip area is saved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A transmitter of a common mode transceiver, comprising:
    a first transistor group, comprising a first transistor and a second transistor connected in series with each other, wherein the second transistors is applied a first well-tracking control; and
    a second transistor group, comprising a third transistor and a fourth transistor connected in series with each other, wherein the third transistor is applied a second well-tracking control,
    wherein there is an output node between the first transistor group and the second transistor group, and the second transistor and the third transistor are coupled to the output node.

2. The transmitter of the common mode transceiver as claimed in claim 1, further comprising:
    a first circuit, coupled to the output node and a ground potential, and configured to perform transient voltage suppression.

3. The transmitter of the common mode transceiver as claimed in claim 1, wherein the second transistor has a second circuit, the second circuit performs the first well-tracking control, and controls a first well-voltage of the second transistor according to a first highest voltage exerted to a source or a drain of the second transistor; the third transistor has a third circuit, and the third circuit performs the second well-tracking control, and controls a second well-voltage of the third transistor according to a second highest voltage exerted to a source or a drain of the third transistor.

4. The transmitter of the common mode transceiver as claimed in claim 1, wherein the first transistor and the second transistor are respectively a low-voltage P-type metal oxide semiconductor transistor and a high-voltage P-type metal oxide semiconductor transistor, and a circuit area of the first transistor is configured between ½ and ¼ of a circuit area of the second transistor.

5. The transmitter of the common mode transceiver as claimed in claim 1, wherein the third transistor and the fourth transistor are respectively a high-voltage N-type metal oxide semiconductor transistor and a low-voltage N-type metal oxide semiconductor transistor, and a circuit area of the fourth transistor is configured between ½ and ¼ of a circuit area of the third transistor.

6. A common mode transceiver, comprising:
    a transmitter, comprising:
        an output stage, comprising:
            a first transistor group, comprising a first transistor and a second transistor connected in series with each other, wherein the second transistor is applied a first well-tracking control; and
            a second transistor group, comprising a third transistor and a fourth transistor connected in series with each other, wherein the third transistor is applied a second well-tracking control, there is an output node between the first transistor group and the second transistor group, and the second transistor and the third transistor are coupled to the output node; and
        a first circuit, coupled to the output node and a ground potential to perform transient voltage suppression; and
    a receiver, coupled to the output node.

7. The common mode transceiver as claimed in claim 6, wherein the second transistor has a second circuit, the second circuit performs the first well-tracking control, and controls a first well-voltage of the second transistor according to a first highest voltage exerted to a source or a drain of the second transistor; the third transistor has a third circuit, and the third circuit performs the second well-tracking control, and controls a second well-voltage of the third transistor according to a second highest voltage exerted to a source or a drain of the third transistor.

8. The common mode transceiver as claimed in claim 6, wherein the first transistor and the second transistor are respectively a low-voltage P-type metal oxide semiconductor transistor and a high-voltage P-type metal oxide semiconductor transistor, and a circuit area of the first transistor is configured between ½ and ¼ of a circuit area of the second transistor.

9. The common mode transceiver as claimed in claim 6, wherein the third transistor and the fourth transistor are respectively a high-voltage N-type metal oxide semiconductor transistor and a low-voltage N-type metal oxide semiconductor transistor, and a circuit area of the fourth transistor is configured between ½ and ¼ of a circuit area of the third transistor.

10. An operating method of a common mode transceiver, comprising:
    providing a first transistor group comprising a first transistor and a second transistor connected in series with each other;
    providing a second transistor group comprising a third transistor and a fourth transistor connected in series with each other; and
    respectively operating the second transistor and the third transistor by performing a first well-tracking control and a second well-tracking control.

11. The operating method of the common mode transceiver as claimed in claim 10, further comprising:
    providing a first circuit coupled to the output node and a ground potential to perform transient voltage suppression.

12. The operating method of the common mode transceiver as claimed in claim 10, wherein the step of respectively operating the second transistor and the third transistor by performing the first well-tracking control and the second well-tracking control comprises:
    configuring a second circuit to the second transistor, wherein the second circuit performs the first well-tracking control, and controls a first well-voltage of the second transistor according to a first highest voltage exerted to a source or a drain of the second transistor; and
    configuring a third circuit to the third transistor, wherein the third circuit performs the second well-tracking control, and controls a second well-voltage of the third transistor according to a second highest voltage exerted to a source or a drain of the third transistor.

13. The operating method of the common mode transceiver as claimed in claim 10, wherein the first transistor and the second transistor are respectively a low-voltage P-type metal oxide semiconductor transistor and a high-voltage P-type metal oxide semiconductor transistor, and a circuit area of the first transistor is configured between ½ and ¼ of a circuit area of the second transistor.

14. The operating method of the common mode transceiver as claimed in claim 10, wherein the third transistor and the fourth transistor are respectively a high-voltage N-type metal oxide semiconductor transistor and a low-voltage N-type metal oxide semiconductor transistor, and a circuit area of the fourth transistor is configured between ½ and ¼ of a circuit area of the third transistor.

* * * * *